United States Patent
Hackenschmied et al.

(10) Patent No.: US 8,502,156 B2
(45) Date of Patent: Aug. 6, 2013

(54) DETECTOR MATERIAL FOR A DETECTOR FOR USE IN CT SYSTEMS, DETECTOR ELEMENT AND DETECTOR

(75) Inventors: Peter Hackenschmied, Nürnberg (DE); Matthias Strassburg, Erlangen (DE)

(73) Assignee: Simens Aktiengesellschaft, Munich (DE)

( * ) Notice: Subject to any disclaimer, the term of this patent is extended or adjusted under 35 U.S.C. 154(b) by 287 days.

(21) Appl. No.: 13/124,216

(22) PCT Filed: Apr. 16, 2009

(86) PCT No.: PCT/EP2009/054504
§ 371 (c)(1),
(2), (4) Date: Apr. 14, 2011

(87) PCT Pub. No.: WO2010/043427
PCT Pub. Date: Apr. 22, 2010

(65) Prior Publication Data
US 2011/0200166 A1 Aug. 18, 2011

(30) Foreign Application Priority Data
Oct. 15, 2008 (EP) .................................... 08018055

(51) Int. Cl.
*H01L 31/0296* (2006.01)
(52) U.S. Cl.
USPC ................................................... 250/370.09
(58) Field of Classification Search
USPC ................................................... 250/370.09
See application file for complete search history.

(56) References Cited

U.S. PATENT DOCUMENTS
5,126,277 A * 6/1992 Inokuchi et al. ............. 438/383
(Continued)

FOREIGN PATENT DOCUMENTS
EP 1388597 A1 2/2004
FR 2836931 A1 9/2003
WO WO-2008054840 A2 5/2008

OTHER PUBLICATIONS
Ruge, I. et al., "Halbleiter-Technologie," Semiconductor Technology, 3rd Edition and English translation.
(Continued)

*Primary Examiner* — Marcus Taningco
(74) *Attorney, Agent, or Firm* — Harness, Dickey & Pierce, P.L.C.

(57) ABSTRACT

A detector material for a detector is disclosed for use in CT systems, particularly in dual-energy CT systems, including a doped semiconductor. In at least one embodiment, the semiconductor is doped with a donator in a concentration, wherein the concentration of the donator corresponds to at least 50% of the maximum solubility thereof in the semiconductor material, and the donator produces flat imperfections having an excitation energy. The flat imperfections can be ionized and can provide additional freely moveable charge carriers. The freely moveable charge carriers can be captured by the spatially separated deep imperfections and thus reduce the number of the charged deep imperfections. In this way, pure time- and radiation-dependent effects, such as polarization, occur more often. The invention further more relates to the use of the detector material in a CT or dual-energy CT system for generating tomographic images of a test object.

31 Claims, 2 Drawing Sheets

U.S. PATENT DOCUMENTS

| | | | |
|---|---|---|---|
| 5,150,191 A | 9/1992 | Motegi et al. | |
| 5,861,321 A | 1/1999 | Tregilgas et al. | |
| 2003/0121468 A1* | 7/2003 | Boone et al. | 117/78 |
| 2003/0209184 A1 | 11/2003 | Kazandjian et al. | |
| 2004/0155255 A1 | 8/2004 | Yamamoto et al. | |
| 2005/0268841 A1 | 12/2005 | Szeles et al. | |
| 2008/0089831 A1 | 4/2008 | Yamamoto et al. | |
| 2009/0321730 A1 | 12/2009 | Lynn et al. | |

OTHER PUBLICATIONS

Schlesinger, T.E. et al., "Cadmium zinc telluride and its use as a nuclear radiation detector material", Materials Science and Engineering, vol. 32, No. 4-5, Apr. 2, 2001, pp. 103-189; Others.

International Search Report.

European Patent Publication No. EP 08018055.7, filed Oct. 15, 2008.

* cited by examiner

DETECTOR MATERIAL FOR A DETECTOR FOR USE IN CT SYSTEMS, DETECTOR ELEMENT AND DETECTOR

PRIORITY STATEMENT

This application is the national phase under 35 U.S.C. §371 of PCT International Application No. PCT/EP2009/054504 which has an International filing date of Apr. 16, 2009, which designated the United States of America, and which claims priority on European patent application number EP08018055 filed Oct. 15, 2008, the entire contents of each of which are hereby incorporated herein by reference.

FIELD

At least one embodiment of the invention generally relates to a detector material for a detector for use in CT systems, particularly in dual energy CT systems, comprising a semiconductor doped with a donor. At least one embodiment of the invention furthermore generally relates to a detector comprising a multiplicity of detector elements, wherein the detector material described above is used.

BACKGROUND

To date, for the detection of gamma and X-radiation, particularly in CT and dual energy CT systems, inter alia direct-conversion detectors based on semiconducting materials, for example CdTe, CdZnTe, CdTeSe and CdZnTeSe, have been used. In order to generate the necessary electrical properties for detector operation, these materials are doped. In general one of the elements Cl, In and Al are used for this, or a combination of at least one of the elements of the third main group with at least one element of the eighth subgroup of the periodic table.

Owing to the intrinsic defects specific to the growth process of the semiconductor materials, and their effects on the charge transport, it has not however yet been possible to convert high radiation densities, such as are employed for example in computed tomography, directly and without loss into electrical pulses. The reason for this is that polarization occurs. Polarization is intended to mean the reduction of the electric field by fixed charges bound to generally deep defects, which can then capture the charge carriers generated by radiation and recombine with them. They can therefore no longer contribute to the electrical pulse which is induced on the electrode on lower side of the detector, so that a significantly lower intensity of the radiation is suggested.

The effective mobility of the charge carriers is significantly reduced owing to the captured charge carriers. A radiation detector, however, must have a high charge carrier mobility so that the electrons and holes formed during the irradiation can be separated, so as to avoid the formation of a space charge in the detector and the polarization effect caused by this. The polarization accordingly limits the maximum flux detectable by a direct-conversion detector.

At present, no way of preventing the polarization effect in a direct-conversion detector is known in the prior art. This thus means that measurement of high radiation fluxes, such as are encountered for example in a CT system, is currently not possible by way of direct-conversion detectors.

SUMMARY

At least one embodiment of the of the invention describes a detector material for a direct-conversion detector for a CT system, in which the polarization effect of the doped defects does not occur, and which is consequently suitable for high-flux measurements.

Advantageous refinements of the invention are the subject-matter of dependent claims.

The inventors have discovered that it is possible to avoid radiation intensity-dependent polarization effects in the detector. Additional defects are introduced into the semiconductor by an excess amount of a doping material. This means that the semiconductor is doped up to its solubility limit. Generally, the solubility of a material defines the concentration of this material which can be dissolved in a solvent. This also applies when the two materials are present in the solid aggregate state. The solubility limit of a doping material is then intended to mean the maximum concentration at which this material can be dissolved in the semiconductor to be doped. With respect to the solubility of a material, reference is made to the book "Halbleiter-Technologie" [Semiconductor Technology], $3^{rd}$ Edition by I. Ruge and H. Mader, published by Springer Verlag.

On first view, doping up to the solubility limit seems to constitute a degradation of the detector properties, since additional defects can capture more charge carriers and therefore ought to further amplify the polarization. In at least one embodiment of the present invention, however, dopant materials which generate flat donor defects are used with a concentration close to their solubility limit in the semiconductor. Owing to their excitation energy of from 10 to 200 meV, they lie just below the conduction band, that is to say the excitation energies lie in the range of the thermal energy at room temperature, i.e. approximately 25 meV. They therefore hinder the charge carrier transport virtually not at all, which is essential for full capture of the charge carriers generated by the X-radiation. Because they are donor defects, they are automatically ionized by the thermal energy by releasing at least one electron in the semiconductor. This subsequently increases the capture cross section of the defects for charge carriers. Yet since these defects are flat, the effect on the charge carrier transport is negligible, since their binding energy is of the order of magnitude of the thermal excitation energy of the charge carriers and these can thus still be excited from the defects back into the conduction band.

The crucial advantage of doping up to the solubility limit is the occupation of intrinsic deep defects by the surplus electrons released by the flat donor defects.

As a result, charge carriers generated by high-energy electromagnetic radiation, for example gamma or X-radiation, can no longer be captured since the deep defect levels are already occupied. This in turn means that no time- and radiation intensity-dependent polarization effects occur in the detector, which have previously prevented the use of conventional direct-conversion detectors for high-flux applications, for example in computed tomography.

At least one embodiment of the invention thus resides in the introduction of additional defects, based on flat defects, into the material of the directly converting radiation detector. The ideal doping material range thereby used is distinguished in that the effect of polarization-generating deep defects is suppressed and the direct-conversion detector can be used even for high-flux applications, such as computed tomography, particularly in dual energy computed tomography.

In accordance with this basic concept, the inventors propose to improve a detector material for a detector for use in CT systems, particularly in dual energy CT systems, including a semiconductor doped with a donor, so that the concentration of the donor is close to its maximum solubility in the semiconductor material and the donor forms flat defects in the semiconductor material.

"Close" is intended to mean a concentration of at least 33% of the maximum solubility. More advantageous, however, is a concentration of at least 75%, preferably 90%, preferably 95%. In principle, the higher the concentration is, the better the deep defects are filled up and the better the polarization effect is avoided.

An advantageous embodiment of the detector material according to the invention is achieved in that the semiconductor material, for example CdTe, CdZnTe, CdZnSe, CdTeSe or CdZnTeSe, can be doped by means of

- the elements F, Cl, Br, I or a combination of at least two of these elements, or
- the elements B, Al, Ga, In or a combination of at least two of these elements, or
- a combination of at least one element of the third main group of the periodic table and at least one element of the eighth subgroup of the periodic table.

These doping materials or combinations listed above are distinguished in that they form flat defects and can be introduced into the semiconductor with a concentration close to their solubility limit.

The scope of at least one embodiment of the invention also includes a CT system, in particular a dual energy CT system, in which a detector includes at least one detector element, advantageously formed by the detector material according to the invention, can be used, and with which tomographic recordings of an object to be examined can be carried out.

The inventive arrangement of at least one embodiment of the detector material gives the following advantages for use in a direct-conversion detector:

- artifact-free and precise measurability of extremely high radiation fluxes, but also of lower radiation fluxes;
- improved signal stability and reproducibility of measurements owing to small fluctuations of the local electric field, since the relevant deep defects have a lesser effect;
- the quality of the response of the direct-conversion detector to the X-radiation is almost flux-independent. This increases the capacity of the detector, particularly when it is used as a counting detector, to convert flux variations exactly into changes in the count rate;
- higher signal-to-noise ratio because of infrequent propagation time deviations of the charge carriers owing to less frequent capture in deep defects;
- relatively little use of material owing to thinner layers. Commercial direct-conversion detectors currently have a thickness of at least 3 mm;
- producibility of the detector, including the doping, by means of various crystal growth methods, for example physical vapor transport (PVT), travelling heat method (THM), vertical Bridgman methods (VBM), metalorganic vapor phase epitaxy/deposition (MOVPE), various methods of vapor phase epitaxy/deposition (VPE), molecular beam epitaxy (MBE), atomic layer epitaxy (ALE); and
- simpler detection of the material composition by measuring the concentration of the doping material or doping materials, for example by means of secondary ion mass spectrometry (SIMS), photoluminescence (PL) and a chemical analysis.

BRIEF DESCRIPTION OF THE DRAWINGS

The invention will be explained in more detail below with reference to the preferred examples with the aid of the figures, for which it should be pointed out that only elements essential for direct understanding of the invention are shown. The following references are used: $E_{d,flat}$: excitation energy of a flat donor defect; $E_{D,flat}$: energy level of a flat donor defect; $E_{d,deep}$: excitation energy of a deep donor defect; $E_{D,deep}$: energy level of a deep donor defect; $E_L$: energy level of the lower band edge of the conduction band; $E_{therm}=k_B*T$: thermal energy at room temperature; $E_V$: energy level of the upper band edge of the valence band; $k_B$: Boltzmann's constant 8.617343*10$^{-5}$ eV/K; X: semiconductor material; Y: donor material.

In detail.

DETAILED DESCRIPTION OF THE EXAMPLE EMBODIMENTS

Figure 1:
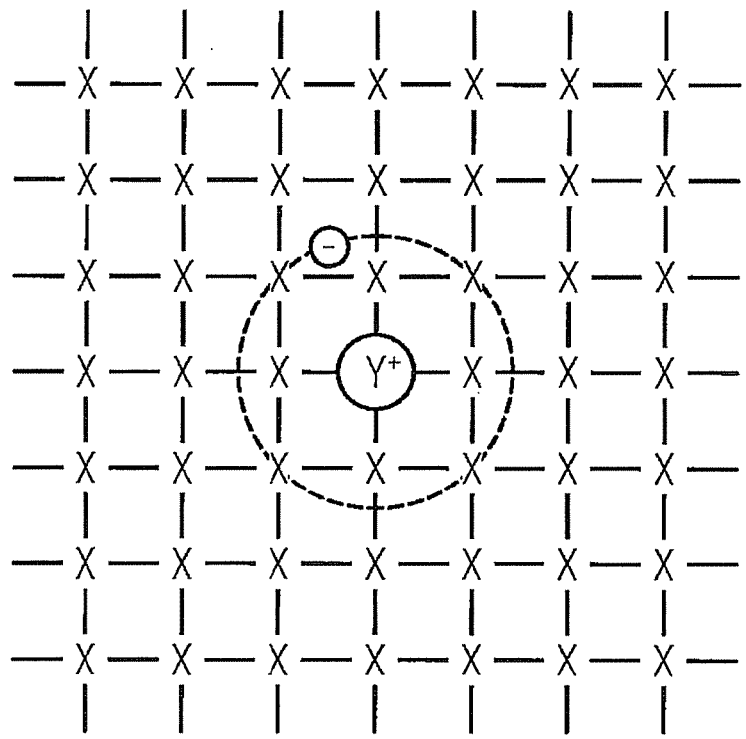
FIG. 1: shows a schematic representation of a semiconductor with a donor atom.

FIG. 1 shows a schematic representation of a semiconductor with a doped donor atom. The atoms of the semiconductor crystal are respectively marked by an X and the donor atom by a Y. The bonds between the atoms are indicated by dashes. In this generalizing case selected by way of example, the donor atom lies at a regular lattice site in the semiconductor crystal and therefore replaces a semiconductor atom. According to the definition of a donor atom, it releases a weakly bound electron into the conduction band. It thus becomes ionized. At the same time, the singly positively charged remnant of the donor atom remains behind.

As a specific example of inventive doping of a semiconductor, the chlorine doping of a CdTe semiconductor will be mentioned. Conventional CdTe:Cl detectors for gamma and X-radiation have a Cl concentration of about 1 to 2*10$^{17}$/cm$^3$. Such detectors are not suitable for high-flux applications, since strong polarization occurs. If the Cl concentration is increased to at least 4*10$^{17}$/cm$^3$, typically to from 5 to 9*10$^{17}$/cm$^3$, the detector properties are improved significantly owing to the mechanisms already mentioned above. This means that the intrinsic deep defects are occupied by the additional charge carriers of the flat defects, so that charge carriers generated by radiation can no longer be captured. With this Cl concentration, the CdTe detector is compatible with high fluxes, that is to say suitable for applications in computed tomography, since the occurrence of polarization effects has been prevented. Another advantage is the faster response of such a detector to electromagnetic radiation, for example gamma or X-radiation, and/or a change in its intensity, compared with conventionally doped detectors, since there are no longer any deep defects, or only negligibly few deep defects, which can capture the charge carriers.

Figure 2:
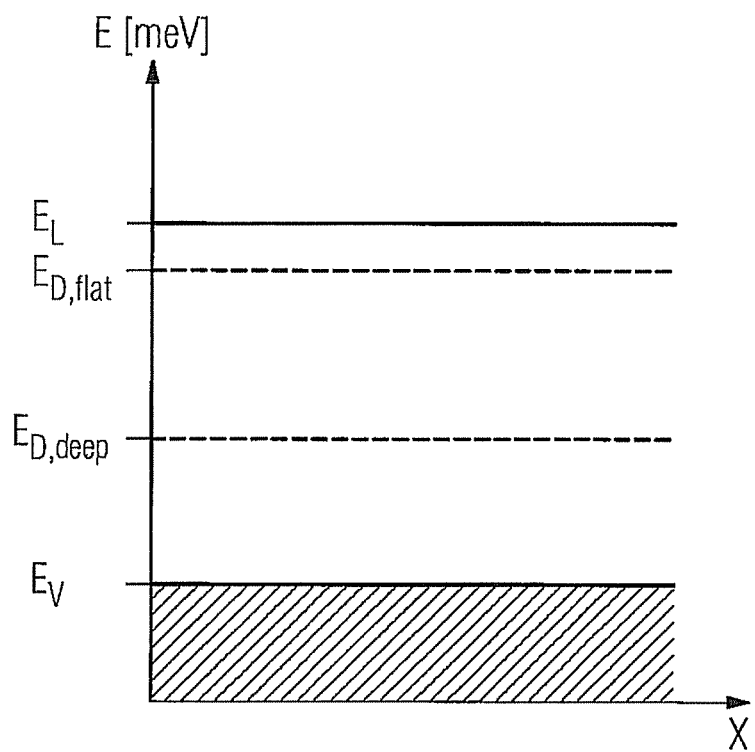
FIG. 2: shows a band model of an n-doped semiconductor with the qualitative position of the energy level in the ground state.
Figure 3:
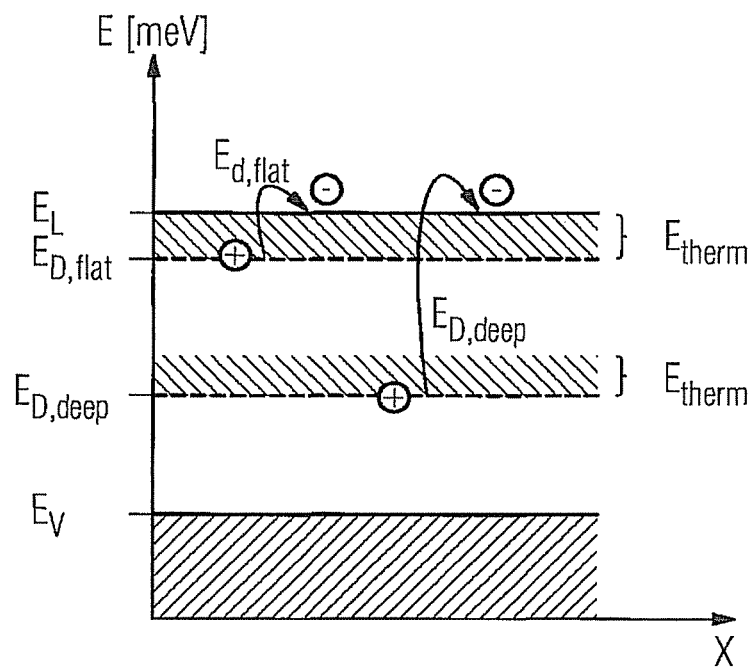
FIG. 3: shows a band model of an n-doped semiconductor with the qualitative position of the energy level in the excited state.
Figure 4:
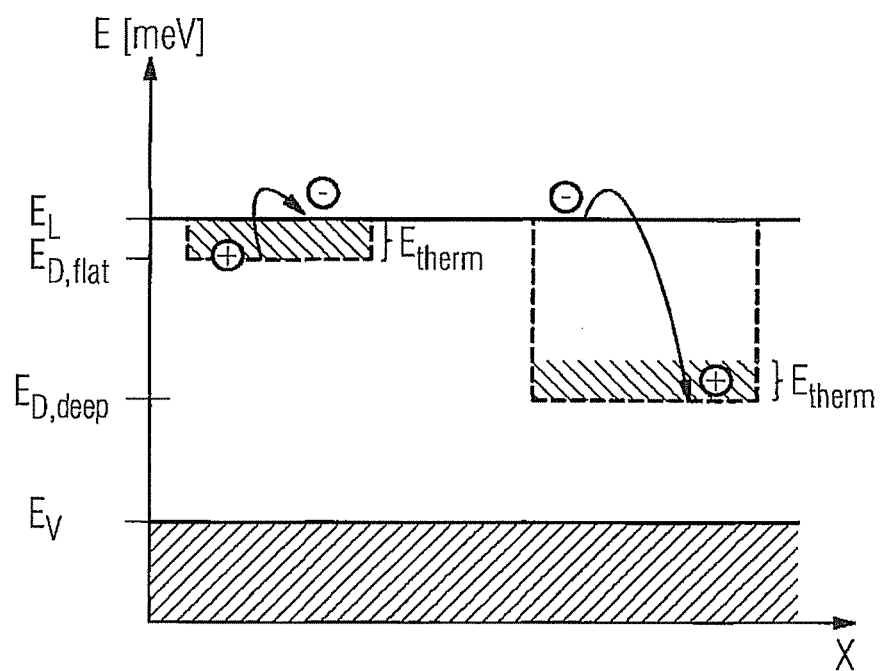
FIG. 4: shows a band model of an n-doped semiconductor with the qualitative position of the energy level and an electron captured in a deep defect.

FIGS. 2 to 4 show the qualitative position of the energy level of an n-doped semiconductor in the band model. The electron energy E is plotted in the unit meV on the ordinate and the position coordinate x is plotted on the abscissa. Between the upper band edge $E_V$ of the valence band and the lower band edge $E_L$ of the conduction band, there is an energy gap $E_L-E_V$. In the energy gap, the energy level $E_{D,flat}$ of a flat donor defects lies in the upper region and the energy level $E_{D,deep}$ of a deep donor defect lies in the middle of the energy gap, see FIG. 2. Mostly, flat defects occur owing to deliberate doping of a semiconductor and deep defects are so-called material-specific intrinsic defects, i.e. a property of the semiconductor per se.

In the ground state, the valence band is unoccupied. By supply of energy, an electron can be excited from the conduction band or from a defect level into the valence band, where it is mobile. This is shown in FIG. 3. The probability that a donor atom in a semiconductor, that is to say a defect, will release an electron depends on the distance of the energy level $E_D$ of the donor atom from the lower band edge of the conduction band $E_L$. If the distance of the energy level. $E_D$ from the conduction band edge $E_L$ is small, as in the case of a flat defect, that is to say the average thermal energy $E_{therm}$ of the charge carriers at room temperature corresponds at least to the energy difference from the band edge $E_L$, elections can be excited into the conduction band by supplying an energy of at least $E_{d,flat} \geq E_{therm}$. A singly positively charged atom remnant then remains at the energy level $E_{D,flat}$ of the defect.

In physics, a room temperature of 293 Kelvin (20° C.) is generally assumed, which gives a thermal energy $E_{therm} = k_B * T = 25$ meV.

If the energy level of the donor atom lies approximately in the middle of the band gap $E_L - E_V$ between the conduction and valence bands of the semiconductor material, that is to say in the case of a deep defect with an energy level $E_{D,deep}$, deep the thermal energy $E_{therm} \ll E_{d,deep}$ of the charge carriers is no longer sufficient to ionize the donor atom, that is to say excite an electron into the conduction band. The donor atom can therefore be ionized only with greater external supply of energy, for example by increasing the temperature.

It is furthermore possible for an electron from the conduction band to be captured by a positively charged atom remnant of a lower energy level, for example that of a deep defect. A schematic representation of this process is shown by FIG. 4. This process is exploited in the present invention. Without the presence of flat defects, virtually all free charge carriers will be captured by the deep defects. This thus means that the electric field or the charge carrier flux will be reduced by recombination of the free charge carriers with the positive atom remnants in the deep defects, and a much lower intensity of the radiation to be detected will therefore be suggested.

By doping up to the maximum saturation of the donor atoms in the semiconductor and automatic ionization of the electrons into the conduction band, additional freely mobile charge carriers are made available. The ionization takes place automatically, that is to say without any supply of energy other than the thermal energy $E_{therm}$ at room temperature. The freely mobile ionized charge carriers of the flat defects can now be captured by the spatially separated deep defects owing to their positive charge, and recombine there with the positive atom remnant. Without a supply of energy greater than the thermal energy $E_{therm}$, the charge carriers can no longer be excited into the conduction band and thus occupy the deep defects. Charge carriers generated by high-energy electromagnetic radiation can therefore no longer be captured. This in turn means that time- and radiation-dependent effects, for example polarization, no longer occur. A direct-conversion detector, which is equipped with the n-doped semiconductor material according to the invention, can be used successfully for high-flux applications, for example in a CT system or dual energy CT system.

Overall, at least one embodiment of the invention thus provides a detector material for a detector for use in CT systems, particularly in dual energy CT systems, comprising a doped semiconductor, which has been improved further by the semiconductor having been doped with a donor at a concentration, the concentration of the donor corresponding to at least 50% of its maximum solubility in the semiconductor material, and the donor forming flat defects in the semiconductor material.

Furthermore, at least one embodiment of the invention relates to the use of this detector material in a CT or dual energy CT system, in order to generate tomographic recordings of an object to be examined.

It is to be understood that the features of the invention as mentioned above may be used not only in the combination respectively indicated, but also in other combinations or individually, without departing from the scope of the invention.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A detector material for a detector, comprising:
 a semiconductor doped with a donor, wherein
 a concentration of the donor lies at its maximum solubility in a material of the semiconductor, and
 the donor forms flat defects in the semiconductor material.

2. The detector material as claimed in claim 1, wherein at least one third of all deep defects in the semiconductor material are occupied by the doping.

3. The detector material as claimed in claim 1, wherein a predominant number of deep defects in the semiconductor material are occupied by the doping.

4. A detector element comprising a detector material as claimed in claim 3.

5. A detector comprising a detector element as claimed in claim 4.

6. A CT system, comprising a detector as claimed in claim 5.

7. The detector material as claimed in claim 1, wherein the semiconductor material corresponds to a material selected from: CdTe, CdZnTe, CdZnSe, CdTeSe and CdZnTeSe.

8. The detector material as claimed in claim 7, wherein the donor includes a material or a combination of at least two materials of the following: F, Cl, Br, and I.

9. A detector element comprising a detector material as claimed in claim 8.

10. A detector comprising a detector element as claimed in claim 9.

11. A CT system, comprising a detector as claimed in claim 10.

12. The CT system as claimed in claim 11, wherein the CT system is a dual energy CT system.

13. The detector material as claimed in claim 7, wherein the donor includes a material or a combination of at least two materials of the following: B, Al, Ga and In.

14. A detector element comprising a detector material as claimed in claim 13.

15. A detector comprising a detector element as claimed in claim 14.

16. A CT system, comprising a detector as claimed in claim 15.

17. The CT system as claimed in claim 16, wherein, the CT system is a dual energy CT system.

18. The detector material as claimed in claim 7, wherein the donor includes a combination of at least one element of the third main group of the periodic table and at least one element of the eighth subgroup of the periodic table.

19. A detector element comprising a detector material as claimed in claim 18.

20. A detector comprising a detector element as claimed in claim 19.

21. A CT system, comprising a detector as claimed in claim 20.

22. The CT system as claimed in claim 21, wherein the CT system is a dual energy CT system.

23. The detector material as claimed in claim 1, wherein the donor includes a material or a combination of at least two materials of the following: F, Cl, Br, and I.

24. The detector material as claimed in claim 1, wherein the donor includes a material or a combination of at least two materials of the following: B, Al, Ga and In.

25. The detector material as claimed in claim 1, wherein the donor includes a combination of at least one element of the third main group of the periodic table and at least one element of the eighth subgroup of the periodic table.

26. A detector element comprising a detector material as claimed in claim 1.

27. A detector comprising a detector element as claimed in claim 26.

28. A CT system, comprising a detector as claimed in claim 27.

29. The CT system as claimed in claim 28, wherein the CT system is a dual energy CT system.

30. The detector material as claimed in claim 1, wherein the detector material for a detector for use in a CT system.

31. The detector material as claimed in claim 1, wherein the detector material for a detector for use in a dual energy CT system.

* * * * *